(12) United States Patent
Oka et al.

(10) Patent No.: US 7,701,121 B2
(45) Date of Patent: Apr. 20, 2010

(54) PIEZOELECTRIC SUBSTANCE AND PIEZOELECTRIC ELEMENT

(75) Inventors: Fumihito Oka, Tsuchiura (JP); Kenji Shibata, Tsukuba (JP)

(73) Assignee: Hitachi Cable, Ltd., Tokyo (JP)

( * ) Notice: Subject to any disclaimer, the term of this patent is extended or adjusted under 35 U.S.C. 154(b) by 111 days.

(21) Appl. No.: 11/873,081

(22) Filed: Oct. 16, 2007

(65) Prior Publication Data

US 2008/0303377 A1     Dec. 11, 2008

(30) Foreign Application Priority Data

Jun. 6, 2007    (JP)   ............... 2007-150687

(51) Int. Cl.
    *H01L 41/187*      (2006.01)
(52) U.S. Cl. ...................... 310/358; 310/311
(58) Field of Classification Search ............... 310/311, 310/358
See application file for complete search history.

(56) References Cited

U.S. PATENT DOCUMENTS 7,518,293 B2 * 4/2009 Shibata et al. ............ 310/358

2009/0091214 A1 * 4/2009 Ozawa et al. ............ 310/358

FOREIGN PATENT DOCUMENTS

| JP | 2002-151754 |   | 5/2002 |
| JP | 2007-019302 A | * | 1/2007 |
| JP | 2007-324538 A | * | 12/2007 |

* cited by examiner

*Primary Examiner*—Thomas M Dougherty
(74) *Attorney, Agent, or Firm*—Scully, Scott, Murphy & Presser, P.C.

(57) ABSTRACT

A piezoelectric substance has a substrate, an electrode formed on the substrate, and a piezoelectric film formed on the electrode. The piezoelectric film is formed of crystals having a main phase of $(Na_xK_yLi_z)NbO_3$ ($0<x<1$, $0<y<1$, $0\leq z\leq 0.1$, $x+y+z=1$). The piezoelectric film is a polycrystalline thin film preferentially oriented to either or both of <001> and <110> crystalline axes in the direction normal to the substrate surface, and the axes of its crystals oriented to each crystalline axis are also formed in the same direction in the in-plane direction of the substrate.

4 Claims, 9 Drawing Sheets

PIEZOELECTRIC SUBSTANCE AND PIEZOELECTRIC ELEMENT

The present application is based on Japanese Patent Application No. 2007-150687 filed on Jun. 6, 2007, the entire contents of which are incorporated herein by reference.

BACKGROUND OF THE INVENTION

1. Field of the Invention

The present invention relates to a piezoelectric substance and a piezoelectric element using the piezoelectric substance.

2. Description of the Related Art

Piezoelectric substances are processed into various piezoelectric elements according to various purposes, and are utilized widely particularly as functional electronic components, such as an actuator, which applies voltage to cause deformation, a sensor, which conversely uses deformation of an element to generate voltage. As piezoelectric substances utilized in actuator and sensor applications, there have hitherto been widely used lead-based dielectrics possessing large piezoelectric properties, especially, $Pb(Zr_{1-X}Ti_X)O_3$-based perovskite-type ferroelectrics called PZT, which are formed typically by sintering oxides comprising individual elements. Also, in recent years, from environmental concerns, the development of piezoelectric substances that contain no lead has been desired, and lithium potassium sodium niobate (general formula: $(Na_xK_yLi_z)NbO_3$ ($0<x<1$, $0<y<1$, $0<z<1$, $x+y+z=1$), etc. has been developed. This lithium potassium sodium niobate (herein, referred to as LKNN) possesses as good a piezoelectric property as PZT, and is therefore expected as a major candidate for lead-free piezoelectric material.

On the other hand, at present, with reduction in size and enhancement in performance of electronic components of each kind, there is also a strong demand for size reduction and performance enhancement of piezoelectric elements as well. However, the thickness of piezoelectric material produced by a conventional manufacturing method using primarily sintering is particularly below 10 μm that approaches the size of crystal grains constituting the material, so the effect thereof becomes unnegligible. For that reason, there arises the problem of noticeable property variation and degradation. In order to avoid it, piezoelectric thin film-forming methods have, in recent years, been studied that apply thin film technology, etc. replaced for the sintering method. A PZT thin film formed by RE sputtering has recently been used practically as an actuator for heads of high-definition high-speed inkjet printers. In this piezoelectric thin film, there is also obviously a demand for lead-free piezoelectric material, as in the above piezoelectric substances.

As the related art, there is JP-A-2002-151754, for example.

As mentioned above, it is possible to produce very thin piezoelectric films, and therefore attempts to use the piezoelectric films in sensors are made at present. The piezoelectric films are deformed to produce voltage in proportion to their displacement (by producing charges in their surface). As sensors utilizing this phenomenon, there are gyrosensors, pressure sensors, etc. These sensors produce displacement as voltage where the voltage for no displacement is a reference. The gyrosensors receive Coriolis force, and also pressure sensors receive pressure, to cause displacement in the piezoelectric thin film. Accordingly, the piezoelectric thin film used in these sensors is required to be able to output sufficient voltage even for slight displacement. Such a piezoelectric thin film is a film having a fixed piezoelectric constant regardless of voltage where the piezoelectric constant is calculated by measuring displacement when applying voltage, utilizing the reverse piezoelectric effect.

The piezoelectric thin film is formed, for example, by sputtering, etc. We examine LKNN films that are lead-free piezoelectric substances. To make the above sensor using this thin film, a $SiO_2$ film is formed on a low-cost silicon substrate. On that $SiO_2$ film is formed an electrode of platinum (Pt), or the like. On that electrode is formed a piezoelectric thin film, using sputtering. The piezoelectric thin film having such structure formed is in a polycrystalline state.

The above piezoelectric thin film, like general ceramic piezoelectric substances, is prominent in having the dependence of piezoelectric properties on the magnitude of displacement but no linear relationship between displacement and voltage. Namely, only slight voltage is produced for small displacement, while large voltage is produced for small displacement. Such a film is a film having a small piezoelectric constant for small voltage and a large piezoelectric constant for large voltage when measuring displacement by applying voltage, utilizing the reverse piezoelectric effect. The piezoelectric thin film having such properties is not suitable for producing a high-sensitivity sensor.

SUMMARY OF THE INVENTION

Accordingly, it is an object of the present invention to provide a piezoelectric substance, which solves the above prior-art problem to have a constant piezoelectric property regardless of voltage applied, and a piezoelectric element using the piezoelectric substance.

(1) In accordance with one embodiment of the invention, a piezoelectric substance comprises:

a substrate;

an electrode formed on the substrate; and a piezoelectric film formed on the electrode, wherein the piezoelectric film comprises crystals having a main phase of $(Na_xK_yLi_z)NbO_3$ ($0<x<1$, $0<y<1$, $0\leq z\leq 0.1$, $x+y+z=1$), and is a polycrystalline thin film preferentially oriented to either or both of <001> and <110> crystalline axes in the direction normal to the substrate surface, and the axes of its crystals oriented to each crystalline axis are also formed in the same direction in the in-plane direction of the substrate.

In the above invention (1), the following modifications and changes can be made.

The substrate comprises Si or MgO, and the electrode comprises Pt or a stacking structure including Pt.

(2) In accordance with another embodiment of the invention, a piezoelectric substance comprises:

a substrate;

an electrode formed on the substrate; and a piezoelectric film formed on the electrode, wherein the piezoelectric film is a polycrystalline thin film preferentially oriented to plural crystalline axes in the direction normal to the substrate surface, and the axes of its crystals with the same orientation axis in the direction normal to the substrate surface are also formed in the same direction in the in-plane direction of the substrate.

(3) In accordance with another embodiment of the invention, a piezoelectric substance comprises:

a substrate; and a polycrystalline substance formed on the substrate, wherein the polycrystalline substance is preferentially oriented to plural crystalline axes in a certain direction, and the axes of its crystals with the same orientation in the direction normal to the substrate surface are also mutually in the same direction in the in-plane direction normal to that direction.

(4) In accordance with another embodiment of the invention, a piezoelectric element comprises:
the piezoelectric substance as recited by any one of (1) to (3); and
an additional electrode provided on the piezoelectric substance.

According to the present invention, it is possible to form a piezoelectric substance having a constant piezoelectric property regardless of voltage applied, and a piezoelectric element using the piezoelectric substance.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
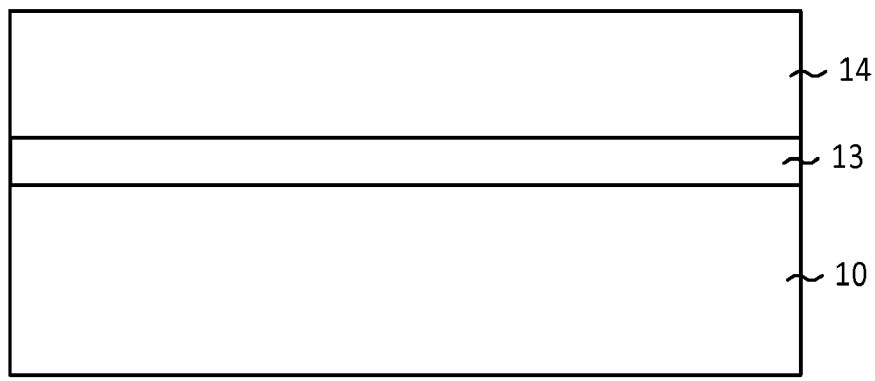
FIG. 1 is a structural diagram showing a piezoelectric substance with an LKNN film formed on a thermally oxidized film-free Si substrate in Example 1 according to the invention.

As described above, the conventional piezoelectric thin film has no linear relationship between displacement and voltage characteristics. The piezoelectric thin film having such properties is not suitable for producing a high-sensitivity sensor. In order to solve this problem, we focus on "arrangement" of piezoelectric thin film crystals. The piezoelectric thin film is formed using sputtering on a lower electrode of Pt or the like, formed on a Si substrate with a $SiO_2$ film. The Pt formed on the $SiO_2$ film is formed by self-orientation as a polycrystalline film <111>-axis-oriented in the direction normal to the substrate surface. In such self-orientation, crystal grains each are formed in mutually totally irregular directions in the in-plane direction of the substrate.

When an LKNN film is formed on this Pt electrode, its crystals are formed in directions associated with the Pt crystals due to being affected by the "arrangement" of the Pt crystals. Namely, the LKNN film is also formed as a polycrystal, and its crystal grains each are in the LKNN (110) and (001) plane lattice-matched with the Pt (111) plane in the direction normal to the substrate surface, but are formed in mutually totally irregular states in the in-plane direction of the substrate.

Accordingly, we attempt to use, as the crystal of the underlying electrode material, material having regularity in the in-plane direction of the substrate as well. Mono- and polycrystalline thin films serve as electrode materials having regularity in the in-plane direction of the substrate. As electrode materials having regularity in the in-plane direction of the substrate as well, there are a Pt (001) electrode formed on a MgO (001) substrate, a Pt electrode formed directly on a Si substrate with no oxidized film, and so on.

When an LKNN film is formed on the electrode comprising these monocrystalline thin films or the polycrystalline thin film electrode having regularity in the in-plane direction of the substrate, the LKNN film is the polycrystalline thin film oriented to two <001> and <110> axes in the direction normal to the substrate surface, in which its crystal grains with these two orientations each are formed in the same direction in the in-plane direction of the substrate as well. Namely, the crystal grains oriented to the <001> axis all are formed in the same direction in the in-plane direction, and likewise the crystal grains oriented to the <110> axis.

By measurement, it is found that the piezoelectric property of this LKNN film is constant versus voltage applied. From this result, it is found that having a fixed piezoelectric constant regardless of voltage applied is achieved by forming the piezoelectric thin film that has plural orientation axes in the direction normal to the substrate surface, and in which its crystal grains with their respective orientation axes are formed in the same direction in the in-plane direction as well.

A piezoelectric substance of a first embodiment comprises a substrate, an electrode formed on this substrate, and a piezoelectric film formed on this electrode, wherein: the piezoelectric film comprises crystals having a main phase of $(Na_xK_yLi_z)NbO_3$ (0<x<1, 0<y<1, 0≦z≦0.1, x+y+z=1), and is a polycrystalline thin film preferentially oriented to the <001> and <110> crystalline axes in the direction normal to the substrate surface, and the axes of its crystals oriented to each crystalline axis are also formed in the same direction in the in-plane direction of the substrate.

It is preferable that the substrate comprises Si or MgO, and that the electrode comprises Pt or a stacking structure including Pt. In the growth of the piezoelectric film, its electrode material serving as an underlying layer is important. The Pt on the Si substrate has the self-orientation property, and the film strongly oriented only to Pt (111) is therefore obtained. For the Pt on MgO (100), the film strongly oriented to Pt (100) lattice-matched with the MgO (100) plane is obtained. The piezoelectric film comprises crystals having a main phase of $(Na_xK_yLi_z)NbO_3$ (0<x<1, 0<y<1, 0≦z≦0.1, x+y+z=1). This LKNN is material having perovskite structure, and a major candidate for lead-free piezoelectric material.

Also, the piezoelectric film is a polycrystalline thin film preferentially oriented to the <001> and <110> crystalline axes in the direction normal to the substrate surface. The LKNN film is polarized in the <000> or <110> axis direction to exhibit the piezoelectric property, and it is therefore preferable that the <001> and <110> axes are oriented in the direction normal to the substrate surface. Further, the axes of its crystals oriented to each crystalline axis are also formed in the same direction in the in-plane direction of the substrate. Even if the crystals are aligned (the film is oriented) perpendicularly to the substrate, if the crystals are not aligned in the in-plane direction of the substrate, its piezoelectric constant is not fixed versus voltage applied.

According to this first embodiment, it is possible to form a piezoelectric substance having a constant piezoelectric property regardless of voltage applied.

A piezoelectric substance of a second embodiment comprises a substrate, an electrode formed on this substrate, and a piezoelectric film formed on this electrode, wherein: the piezoelectric film is a polycrystalline thin film preferentially oriented to plural crystalline axes in the direction normal to the substrate surface, and the axes of its crystals with the same orientation axis in the direction normal to the substrate surface are also formed in the same direction in the in-plane direction of the substrate.

To have a fixed piezoelectric constant regardless of voltage applied, it is preferable to form the piezoelectric thin film that has plural orientation axes in the direction normal to the substrate surface, and in which its crystal grains with their respective orientation axes are formed in the same direction in the in-plane direction as well.

According to this second embodiment, it is possible to form a piezoelectric substance having a constant piezoelectric property regardless of voltage applied.

A piezoelectric substance of a third embodiment comprises a substrate, an electrode formed on this substrate, and a piezoelectric film formed on this electrode, wherein: the piezoelectric film is a polycrystalline substance and this polycrystalline substance is preferentially oriented to plural crystalline axes in a certain direction, and the axes of its crystals with the same orientation in the direction normal to the substrate surface are also mutually in the same direction in the in-plane direction normal to that direction.

When the piezoelectric film is a polycrystalline substance and this polycrystalline substance is preferentially oriented to plural crystalline axes in a certain direction, and the axes of its crystals with the same orientation in the direction normal to the substrate surface are also mutually in the same direction in the in-plane direction normal to that direction, it is possible to form the piezoelectric substance having a constant piezoelectric property regardless of voltage applied.

A piezoelectric element of a fourth embodiment comprises an additional electrode provided on the piezoelectric substance of any of the first to third embodiments. It is preferable that the electrode comprises Pt or a stacking structure including Pt.

According to this fourth embodiment, it is possible to form a piezoelectric element having a constant piezoelectric property regardless of voltage applied, for example, functional electronic components such as an actuator, a sensor, and the like.

Further, the unit lattice of the LKNN crystals herein is defined as the same unit lattice as $KNbO_3$ defined in ICDD (ICDD number 32-0822), in which lithium and sodium serve as a substitute for the site of potassium. Further, the a-, b- and c-axis are in the direction of C<A<B where A, B and C are the lengths of their respective unit lattices.

EXAMPLES

Examples 1 and 2 and Comparison example will be explained where piezoelectric substance samples are formed that include a 3 μm-thick LKNN film as a piezoelectric film.

Example 1

First, prepared is a substrate with an electrode on which an LKNN film 14 is to be formed.

As shown in FIG. 1, the substrate uses a Si (001) substrate 10 not oxidized thermally. Formed directly on this thermally oxidized film-free Si substrate 10 is a Pt electrode 13. The film formation of this Pt electrode 13 uses sputtering. The substrate temperature is 300° C., and the film formation is performed at 700° C. so as to inherit the crystallinity of the underlying Si substrate 10 of the Pt electrode 13. When the Pt electrode 13 is formed directly on the Si substrate 10, the Pt crystals are <111>-axis-oriented in the direction normal to the surface of the Si substrate 10, and the axes of the axially oriented Pt crystals are also aligned in the same direction in the in-plane direction of the Si substrate 10. In this manner, the substrate with the electrode is prepared in which the Pt crystals of the electrode are arranged regularly in the in-plane direction as well.

Next, formed on this substrate with the electrode is an LKNN film 14. The composition of the LKNN film 14 is $(Na_xK_yLi_z)NbO_3$, x=0.495, y=0.495, z=0.01. Also, the film formation method uses RF magnetron sputtering. The film formation conditions are that: the substrate temperature is 600° C., and sputtering gas uses argon gas and oxygen gas, in which: its ratio is 100:2, and RF power is 20 W. The LKNN film 14 formation is followed by measuring the thickness of the LKNN film 14 using a profilometer, which gives 3 μm. In this manner, the piezoelectric substance that includes the 3 μm-thick LKNN film 14, the substrate with the LKNN film, is formed.

Example 2

Figure 2:
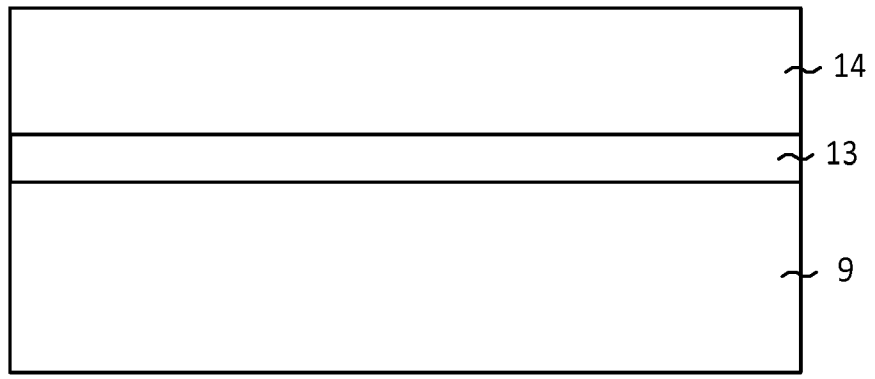
FIG. 2 is a structural diagram showing a piezoelectric substance with an LKNN film formed on a MgO substrate in Example 2 according to the invention.

As shown in FIG. 2, in the same conditions as in Example 1, except that the substrate uses a MgO substrate 9, a Pt electrode 13 is formed directly on the MgO substrate 9. When the Pt electrode 13 is formed directly on the MgO substrate 9, as in Example 1, the Pt crystals are <100>-axis-oriented in the direction normal to the surface of the MgO substrate 9, and the axes of the axially oriented Pt crystals are also aligned in the same direction in the in-plane direction of the MgO substrate 9. On this Pt electrode 13 in the same conditions as in Example 1 is formed a 3 μm-thick LKNN film 14, which results in the piezoelectric substance that includes the 3 μm-thick LKNN film 14.

Comparison Example

Figure 3:
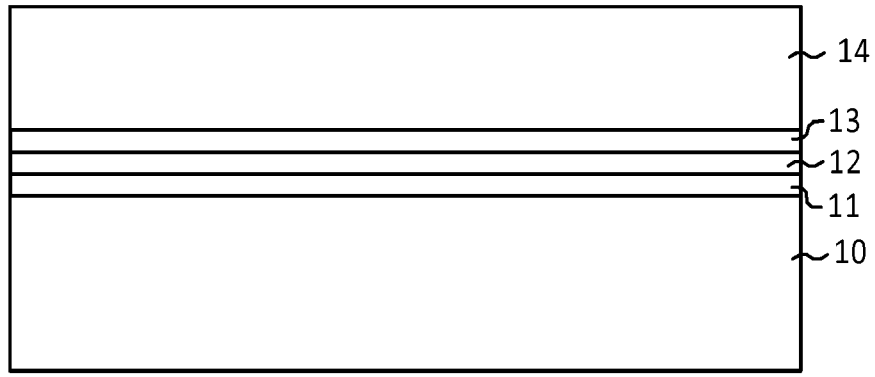
FIG. 3 is a structural diagram showing a piezoelectric substance with an LKNN film formed on a Si substrate with a thermally oxidized film in a comparison example.
Figure 4A:
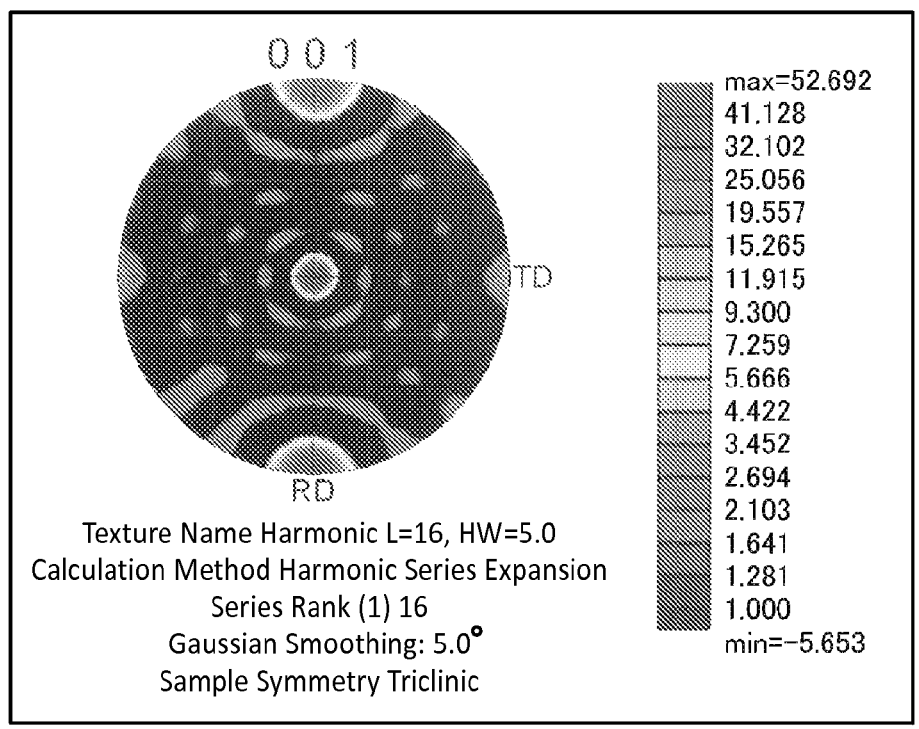
FIGS. 4A-4C and FIG. 4D are respectively pole and antipole figures showing EBSD measurement results for the piezoelectric substance with an LKNN film formed on a thermally oxidized film-free Si substrate in Example 1 according to the invention.
Figure 4B:
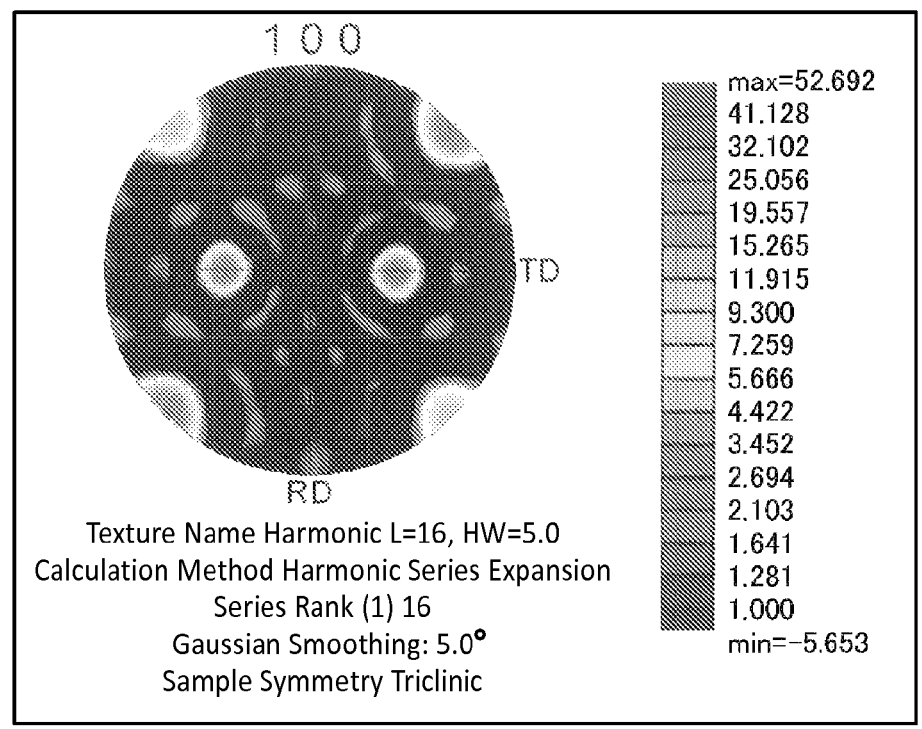
Figure 4C:
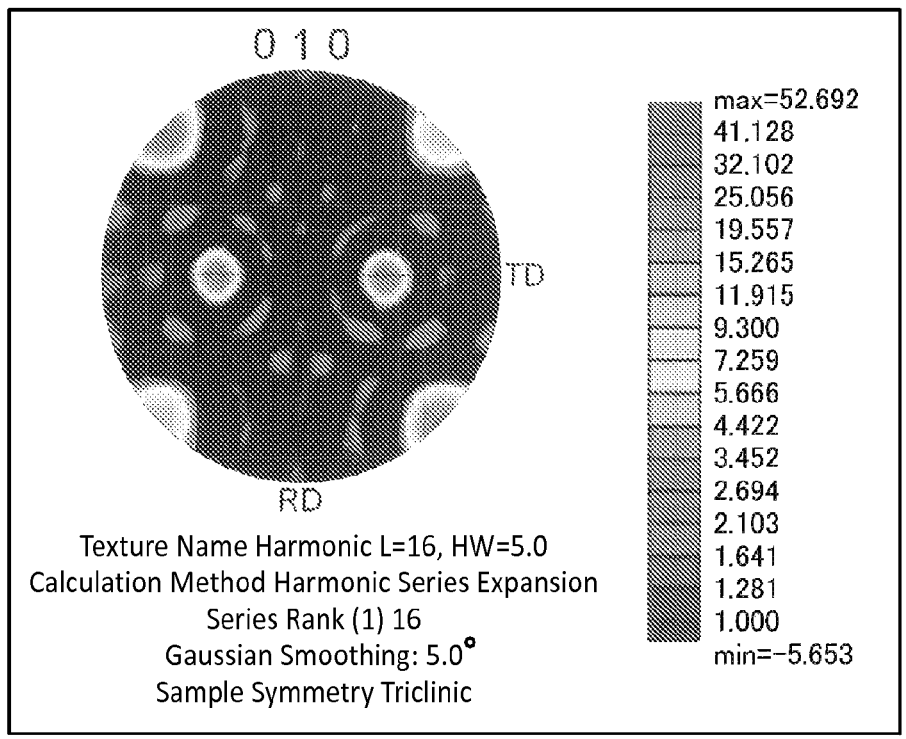
Figure 4D:
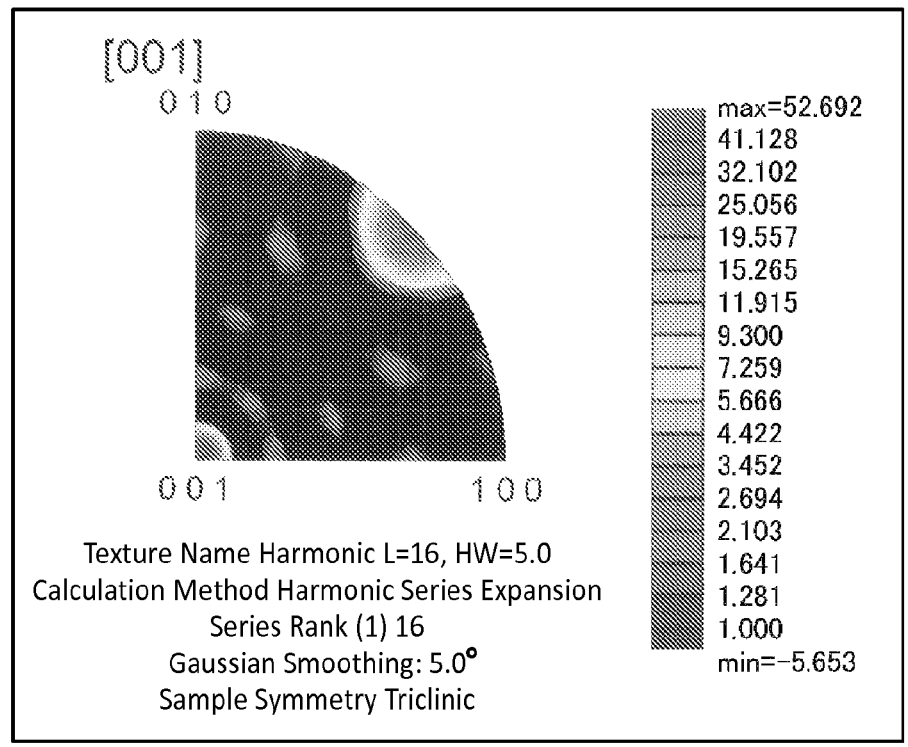
Figure 5A:
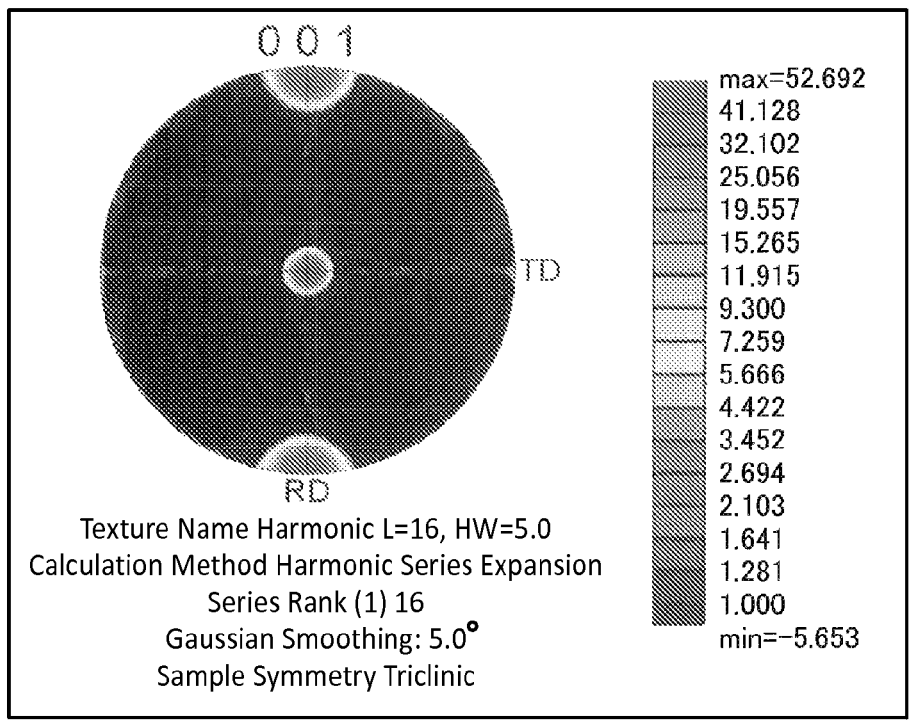
FIGS. 5A-5C and FIG. 5D are respectively pole and antipole figures showing EBSD measurement results for the piezoelectric substance with an LKNN film formed on a MgO substrate in Example 2 according to the invention.
Figure 5B:
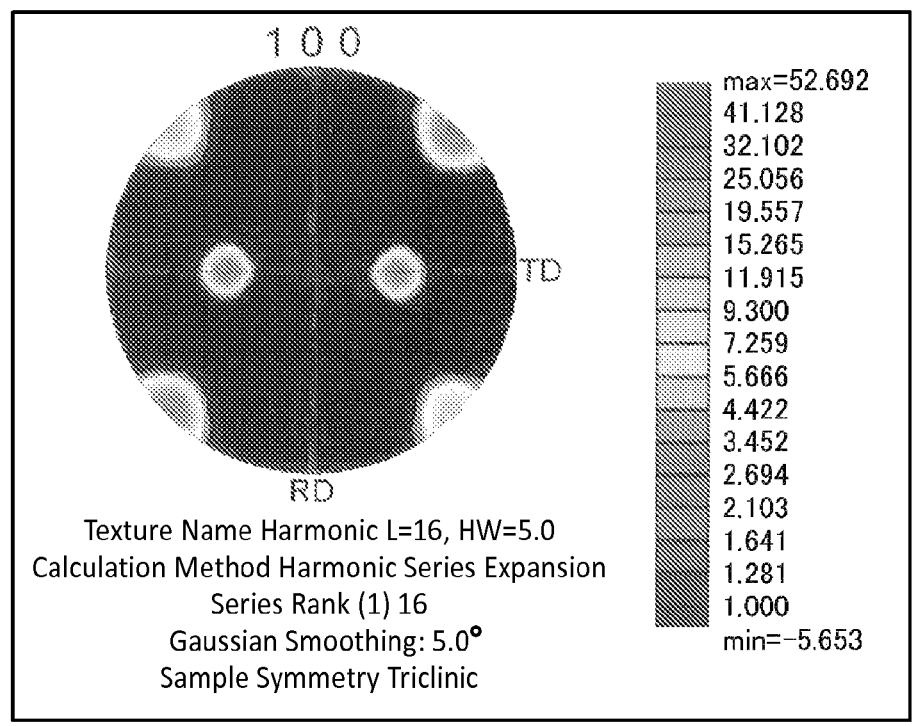
Figure 5C:
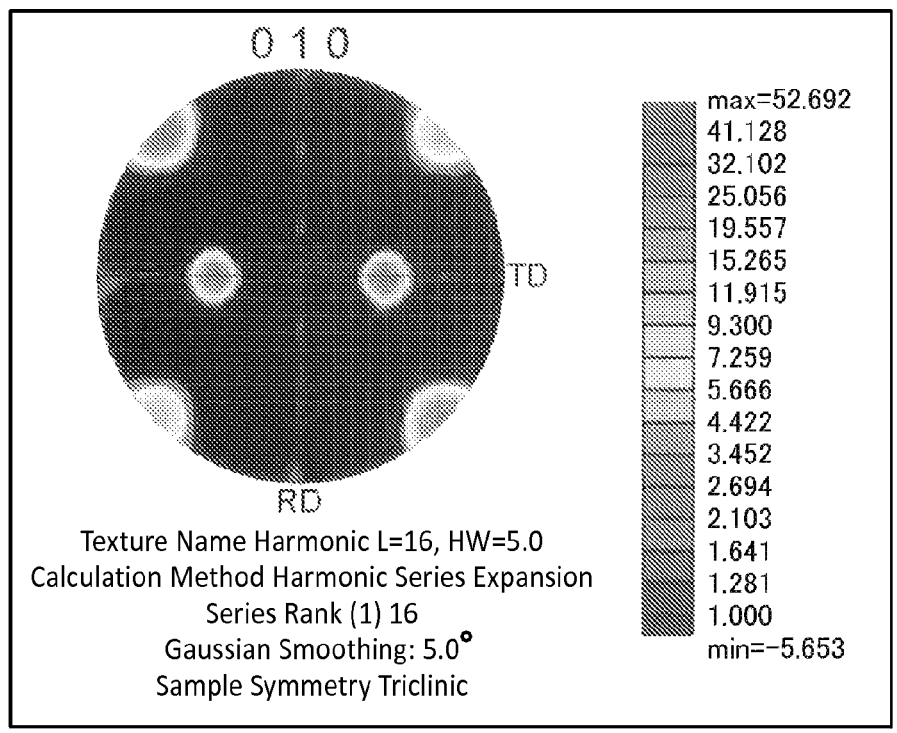
Figure 5D:
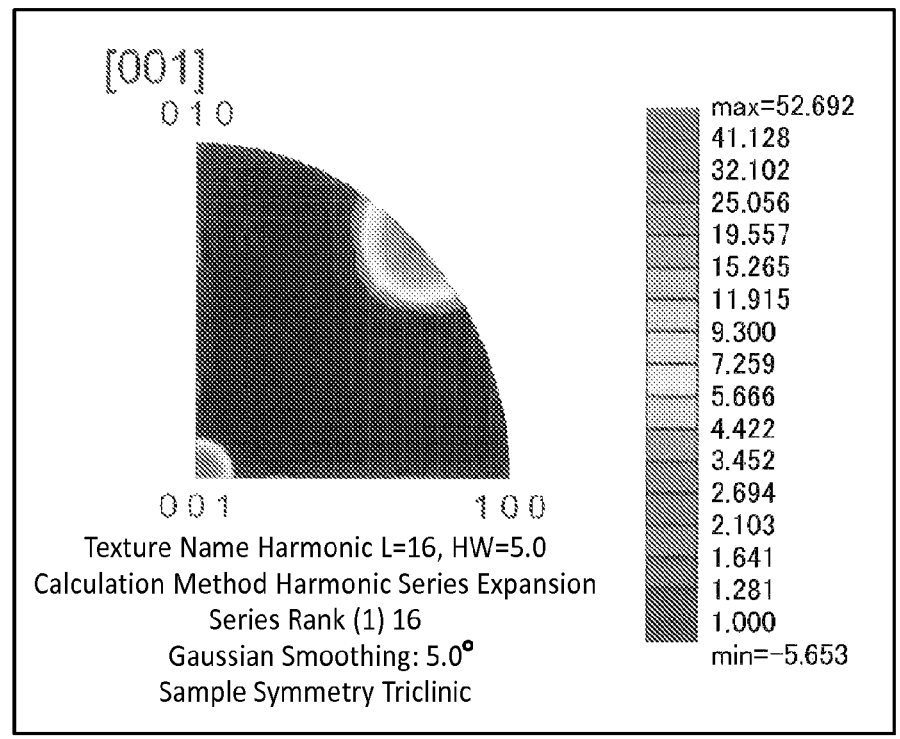

As shown in FIG. 3, a Si (001) substrate 10 is oxidized thermally to form a $SiO_2$ film 11 thereon. In the same conditions as in Example 1, except that a titanium film (Ti film) 12 is formed on the $SiO_2$ film 11 to enhance adherence, a Pt electrode 13 is formed on the substrate with the $SiO_2$ film 11. Where the $SiO_2$ film 11 is formed on the Si substrate 10, the Pt crystals are <111>-axis-oriented by Pt self-orientation in the direction normal to the surface of the Si substrate 10, but has no regularity in the in-plane direction because the Pt crystals do not inherit the crystallinity of the Si substrate 10 at all. On this Pt electrode 13 with no crystalline regularity in the in-plane direction in the same conditions as in Example 1 is formed a 3 μm-thick LKNN film 14, which results in the piezoelectric substance that includes the 3 μm-thick LKNN film 14.

Comparison Results of Examples 1 and 2 to Comparison Example

For the purpose of examining the LKNN film orientation of Examples 1 and 2 and the comparison example fabricated in this manner, EBSD (Electron Back-scattered Diffraction) measurement is made. The results thereof are shown with pole figures in FIGS. 4-6. The pole figures are used to determine in-plane orientation. In FIGS. 4-6, FIGS. 4A-6A show {001} pole figures, FIGS. 4B-6B {100} pole figures, FIGS. 4C-6C {010} pole figures, and FIGS. 4D-6D antipole figures viewed in the direction normal to the substrate surface. Also, in the pole figures, TD shows the transverse direction, and RD the rolling direction. The direction perpendicular to the page is the direction normal (ND) to the rolled surface.

From FIGS. 4 and 5, it is found that in Example 1 where an LKNN film is formed on a thermally oxidized film-free Si substrate, and Example 2 where an LKNN film is formed on a MgO substrate, the LKNN film is oriented to the <001> and <110> crystalline axes in the direction normal to the substrate surface, and is formed regularly in the in-plane direction as well. In FIG. 5, the clearer pole figures are obtained than in FIG. 4, and in FIG. 4 the poles are slightly more faintly seen than in FIG. 5 in which the poles are clearly seen. Further, the intensity scale is minimum −5.653, and maximum 52.692, and the intensity increases from bottom to top, and the maximum value is taken at the brightest pole, while the minimum value is taken at the darkest background.

Figure 6A:
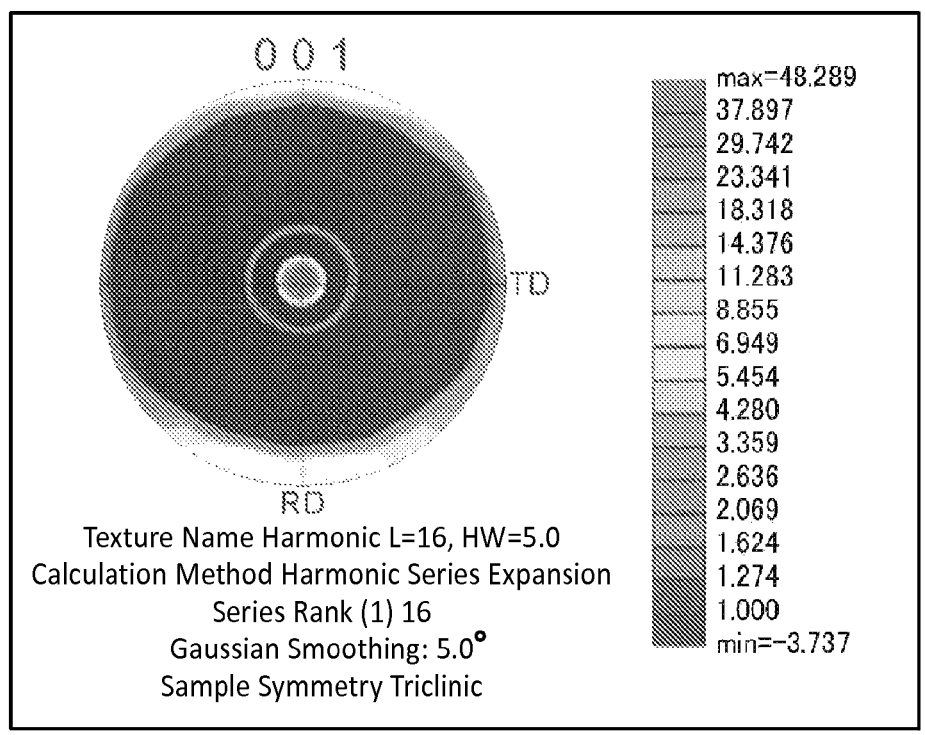
FIGS. 6A-6C and FIG. 6D are respectively pole and antipole figures showing EBSD measurement results for the piezoelectric substance with an LKNN film formed on a Si substrate with a thermally oxidized film in the comparison example.
Figure 6B:
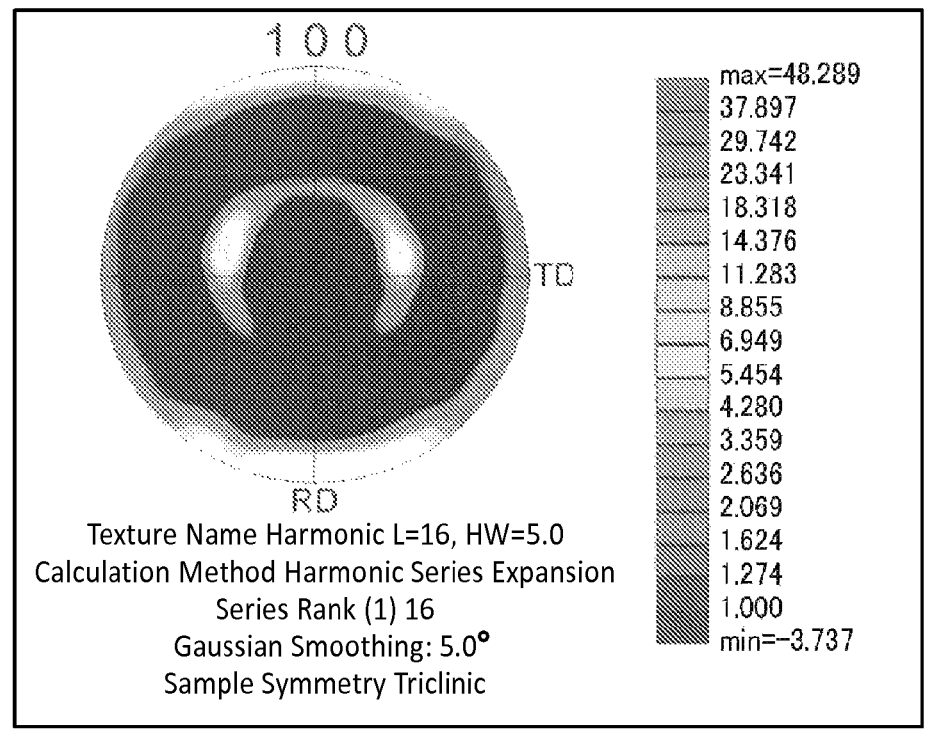
Figure 6C:
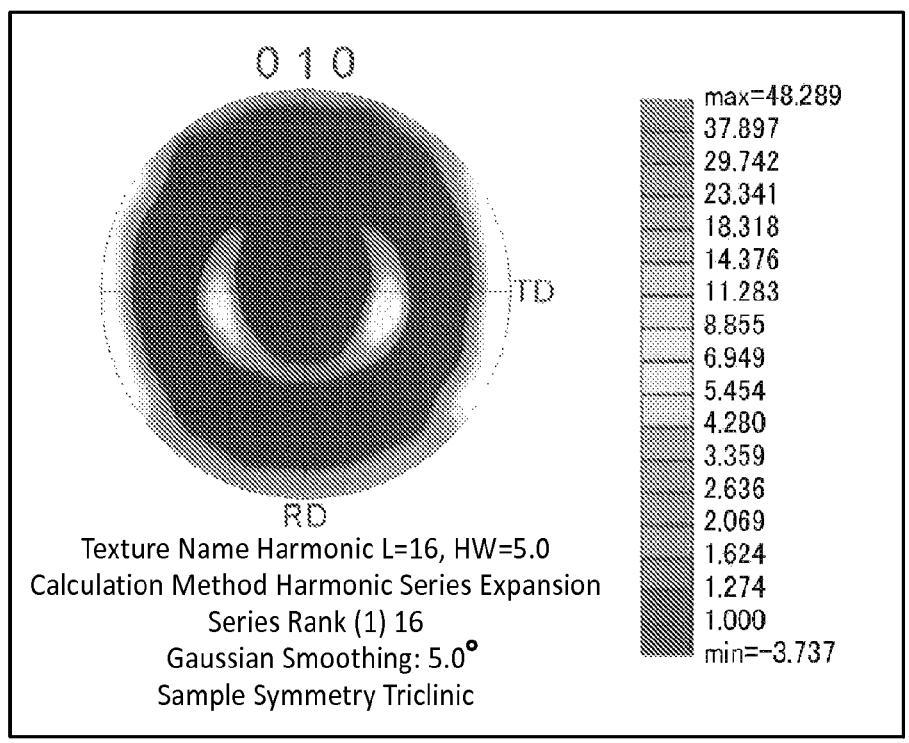
Figure 6D:
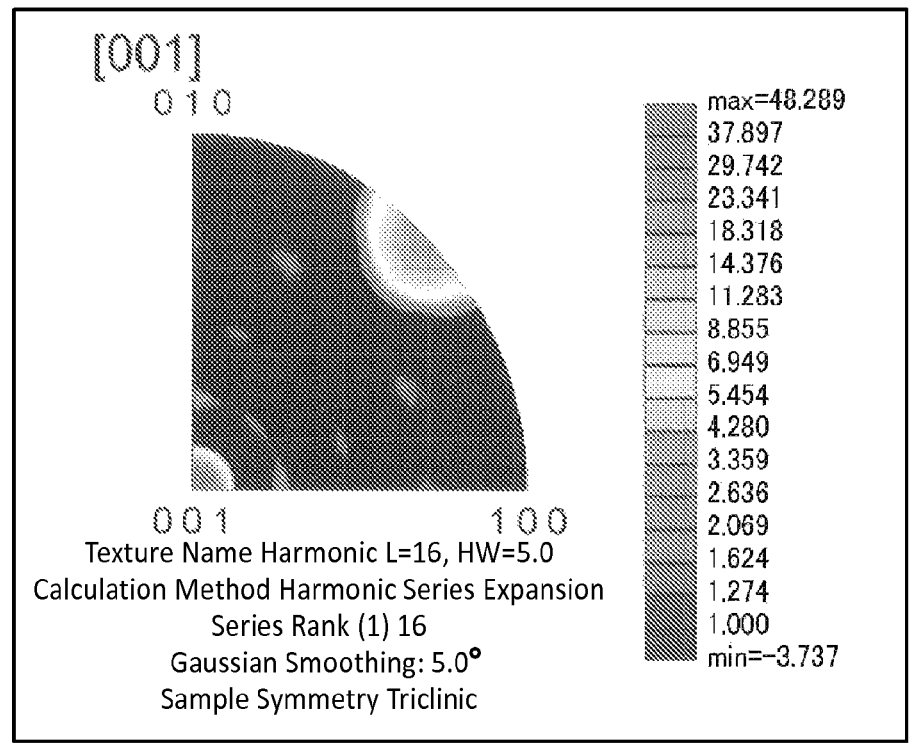

From the pole figures of FIGS. 6A-6C and the antipole figure of FIG. 6D, on the other hand, it is found that in the comparison example where an LKNN film is formed on a Si substrate with a thermally oxidized film, the LKNN film is oriented to the <001> and <110> axes in the direction normal to the surface of the Si substrate, but has no regularity in the in-plane direction at all. In FIG. 6, the less clear pole figures are obtained than in FIG. 4, and the concentric distribution is seen. Further, in FIG. 6, the intensity scale is minimum −3.737, and maximum 48.289.

Further, the proportion of the crystal grains oriented to particular axes, for example, <001> and <110> axes in the direction normal to the substrate surface, is more than 85% relative to the whole, and the deviation of the crystalline axis direction of the crystal grains arranged in the direction normal to the substrate surface, and in the in-plane direction of the substrate, is within ±10°.

Figure 7:
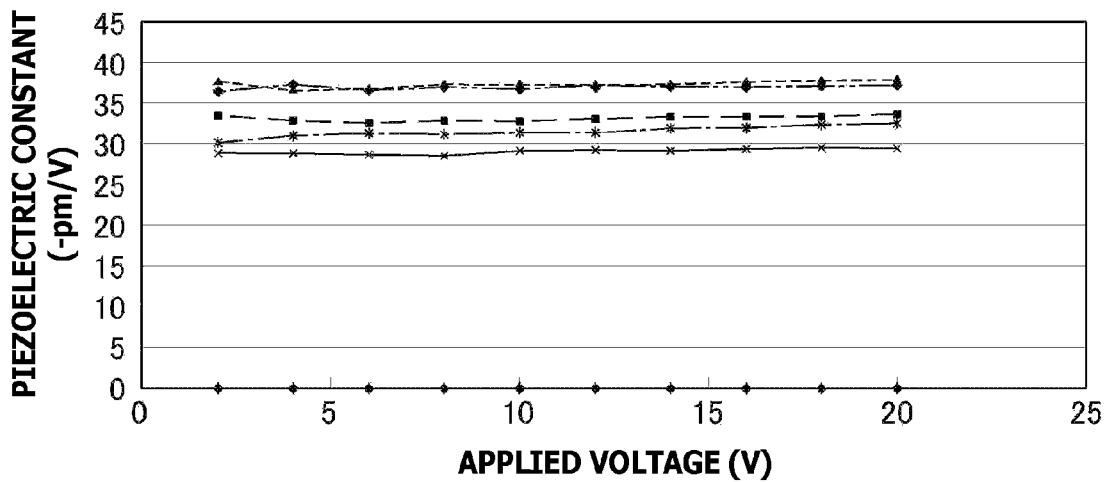
FIG. 7 is a piezoelectric characteristic diagram of the piezoelectric substance with an LKNN film formed on a thermally oxidized film-free Si substrate in Example 1 according to the invention.
Figure 8:
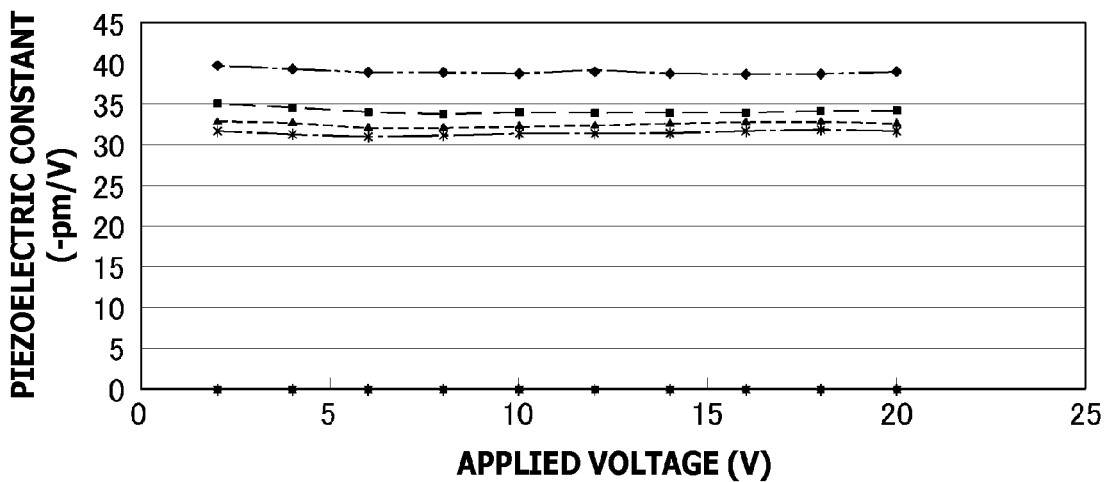
FIG. 8 is a piezoelectric characteristic diagram of the piezoelectric substance with an LKNN film formed on a MgO substrate in Example 2 according to the invention.
Figure 9:
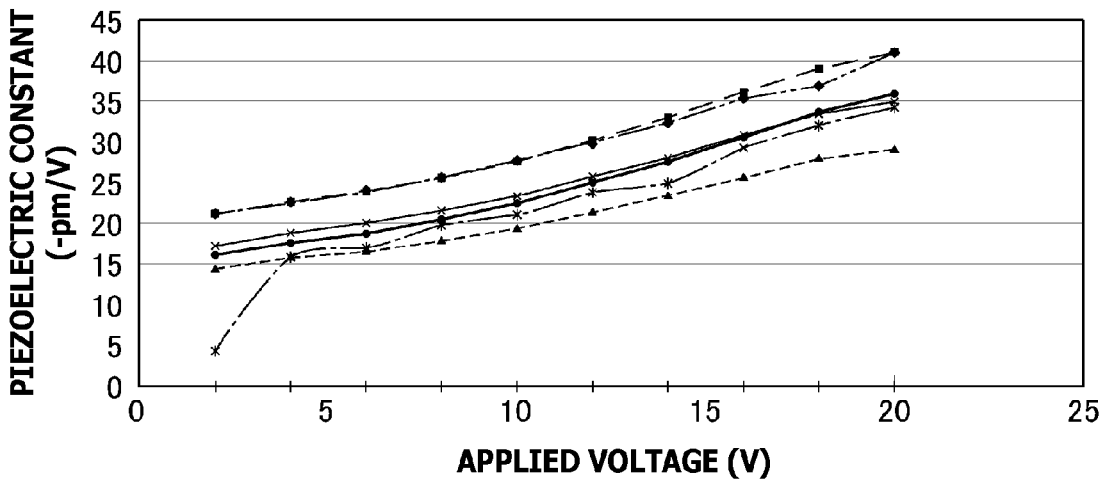
FIG. 9 is a piezoelectric characteristic diagram of the piezoelectric substance with an LKNN film formed on a Si substrate with a thermally oxidized film in the comparison example.
Figures 10A, 10B:
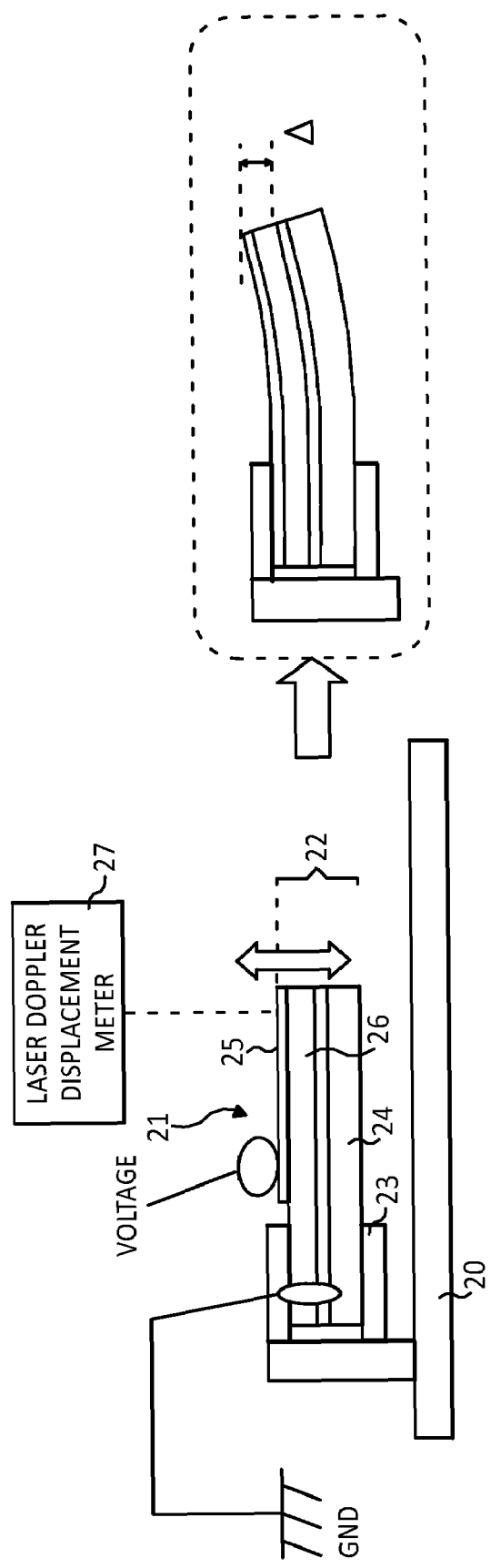
FIGS. 10A and 10B are schematic diagrams showing unimorph cantilever shape and measurement, respectively, used to measure piezoelectric properties in the above Examples and Comparison example.

The piezoelectric properties of these samples are measured. Used as its measuring instrument is a unimorph cantilever 21 formed on a vibration-removing board 20, as shown in FIG. 10. First, a 20 μm-long and 3 mm-wide strip sample 22 is cut out of the substrates with the LKNN film of Examples 1 and 2 and the comparison example, and the longitudinal end of that sample 22 is fixed with a clamp 23 to form a convenient unimorph cantilever 21 (FIG. 10A). In this state, voltage is applied to the LKNN film 26 between the Pt electrode 24 of the sample 22 and upper electrode 25 formed on the sample 22, to expand and contract the LKNN film 26 to operate the end of the unimorph cantilever 21 (the arrow). Its end displacement Δ (FIG. 10B) is measured with a laser Doppler displacement meter 27. The measured results are shown in FIGS. 7-9. In these figures, the horizontal axis is voltage (V) applied, and the vertical axis is piezoelectric constant (−pm/V).

As shown in FIGS. 7 and 8, it is found that in Example 1 where an LKNN film is formed on a thermally oxidized film-free Si substrate, and Example 2 where an LKNN film is formed on a MgO substrate, the piezoelectric constant $d_{31}$ is fixed. In contrast, as shown in FIG. 9, in the comparison example where an LKNN film is formed on a Si substrate with a thermally oxidized film, the piezoelectric constant $d_{31}$ is not fixed versus voltage applied, and the piezoelectric property is small for small voltage. From this result, it is found that, by forming a piezoelectric thin film in which its crystals are arranged regularly in the in-plane direction of the substrate as well as in the direction normal to the substrate surface, its piezoelectric constant can be fixed regardless of voltage applied.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A piezoelectric substance, comprising:
a substrate;
an electrode formed on the substrate; and
a piezoelectric film formed on the electrode,
wherein the piezoelectric film comprises crystals having a main phase of $(Na_xK_yLi_z)NbO_3$ ($0<x<1$, $0<y<1$, $0\leq z\leq 0.1$, $x+y+z=1$), and is a polycrystalline thin film oriented to either or both of <001> and <110> crystalline axes in the direction normal to the substrate surface, and the axes of its crystals oriented to each crystalline axis are also formed in the same direction in the in-plane direction of the substrate.

2. The piezoelectric substance according to claim 1, wherein:
the substrate comprises Si or MgO, and the electrode comprises Pt or a stacking structure including Pt.

3. A piezoelectric element, comprising:
the piezoelectric substance as defined in claim 1; and
an additional electrode provided on the piezoelectric substance.

4. A piezoelectric element, comprising:
the piezoelectric substance as defined in claim 2; and
an additional electrode provided on the piezoelectric substance.

* * * * *